US009303811B1

United States Patent
Lutz, Jr. et al.

(10) Patent No.: US 9,303,811 B1
(45) Date of Patent: Apr. 5, 2016

(54) CONFIGURABLE MOUNTING BRACKET FOR MOUNTING RAIL INSTALLATIONS

(71) Applicant: Cisco Technology, Inc., San Jose, CA (US)

(72) Inventors: Ronald D. Lutz, Jr., Round Rock, TX (US); Mark Feldmeyer, San Jose, CA (US); Lwin O. Tint, Fremont, CA (US); Justin X. Hower, Santa Clara, CA (US); Jason R. Hess, Austin, TX (US)

(73) Assignee: Cisco Technology, Inc., San Jose, CA (US)

( * ) Notice: Subject to any disclaimer, the term of this patent is extended or adjusted under 35 U.S.C. 154(b) by 41 days.

(21) Appl. No.: 14/177,327

(22) Filed: Feb. 11, 2014

(51) Int. Cl.
| | |
|---|---|
| H02B 1/015 | (2006.01) |
| H02B 1/052 | (2006.01) |
| F16M 13/02 | (2006.01) |
| H05K 13/00 | (2006.01) |
| H01R 9/26 | (2006.01) |
| B66C 7/08 | (2006.01) |

(52) U.S. Cl.
CPC .............. F16M 13/022 (2013.01); H05K 13/00 (2013.01); B66C 7/08 (2013.01); H01R 9/2608 (2013.01); H02B 1/052 (2013.01)

(58) Field of Classification Search
CPC ...... H01R 9/2608; H02B 1/105; H02B 1/052; H02B 1/0523; H02B 1/0256; B66C 7/08
USPC ......... 248/221.11, 214, 694, 298.1, 339, 917; 439/532, 627, 325, 529, 94, 716; 361/732, 627, 807, 825; 403/321, 403/322.4, 325
See application file for complete search history.

(56) References Cited

U.S. PATENT DOCUMENTS

| | | | | |
|---|---|---|---|---|
| 5,135,415 | A | * | 8/1992 | Huber ........................... 439/716 |
| 5,192,227 | A | * | 3/1993 | Bales ............................ 439/532 |
| 6,371,435 | B1 | * | 4/2002 | Landis et al. ................. 248/694 |
| 6,610,922 | B1 | | 8/2003 | Twiss et al. |
| 6,961,052 | B1 | | 11/2005 | Vaziri |
| 7,316,379 | B1 | * | 1/2008 | Graham ..................... 248/298.1 |
| 7,374,453 | B1 | * | 5/2008 | Allcock et al. ............... 439/532 |
| 7,878,473 | B1 | * | 2/2011 | Oh ................................ 248/339 |
| 8,262,044 | B2 | * | 9/2012 | Luijben et al. ............. 248/276.1 |
| 2006/0077647 | A1 | | 4/2006 | Lu et al. |
| 2011/0265393 | A1 | | 11/2011 | Mass et al. |
| 2013/0242496 | A1 | | 9/2013 | Ahmad et al. |

OTHER PUBLICATIONS

"Din Rail Mounting Bracket Kit for FlexPoint and iConverter User Manual", Model 8250-0, Form 040-08250-001B, Sep. 2007, 2 pages, UniDIN, Omnitron Systems Technology, Irvine, CA.
"Installing the Router", Chapter 2, Cisco 819 Integrated Services Router Hardware Installation Guide, Text Part No. OL-23125-02, Jul. 2013, 18 pages, Cisco Systems, Inc., San Jose, CA.

* cited by examiner

*Primary Examiner* — Tan Le
(74) *Attorney, Agent, or Firm* — Parker Ibrahim & Berg LLC; James M. Behmke; Stephen D. LeBarron

(57) ABSTRACT

In one embodiment, an apparatus includes a frame configured to hold an electronic device. A back side of the frame includes a plurality of clips which are configured to receive a mounting rail. One or more retractable levers are attached at a first portion of each clip to prevent movement of the frame along the mounting rail. The frame includes a plurality of mounting apertures that are configured to receive the electronic device based on a plurality of mounting configurations. The frame is configured to attach onto the mounting rail via the clips in various orientations selected from the plurality of mounting configurations.

20 Claims, 9 Drawing Sheets

CONFIGURABLE MOUNTING BRACKET FOR MOUNTING RAIL INSTALLATIONS

TECHNICAL FIELD

The present disclosure relates generally to mounting brackets, and, more particularly, to a configurable mounting bracket for mounting rail installations.

BACKGROUND

In general, "DIN" rails are used for mounting various electronic devices onto equipment racks. A DIN rail, as is generally understood by those skilled in the art, is a type of mounting rail based on standards published by the Deutsches Institut fur Normung (DIN) in Germany, and has been adopted worldwide. In particular, a mounting bracket specifically designed for DIN rails may be used to install devices in control cabinets for manufacturing facilities, power stations, traffic control, food processing, and the like.

Various known mounting systems include a DIN rail built into the product to be installed and DIN adapter kits having a fixed configuration. In addition, hanging brackets have been developed that hang on the DIN rail. Typically, in these known systems multiple brackets are required to accommodate the various mounting configurations of the products to be installed.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

According to one or more embodiments of the disclosure, a plurality of clips may be attached to a back side of a frame configured to hold an electronic device, and the plurality of clips may be configured to receive a mounting rail. One or more retractable levers may be attached at a first portion of each clip to prevent movement of the frame along the mounting rail (e.g., generated from vibration). In addition, the frame may have a plurality of mounting apertures configured to receive the electronic device based on a plurality of mounting configurations. The frame may be configured to attach onto the mounting rail via the clips in various orientations selected from the plurality of mounting configurations.

Description

The techniques herein provide a configurable mounting bracket for mounting rail installations, e.g., standardized rail installations such as a DIN rail.

Figure 1:
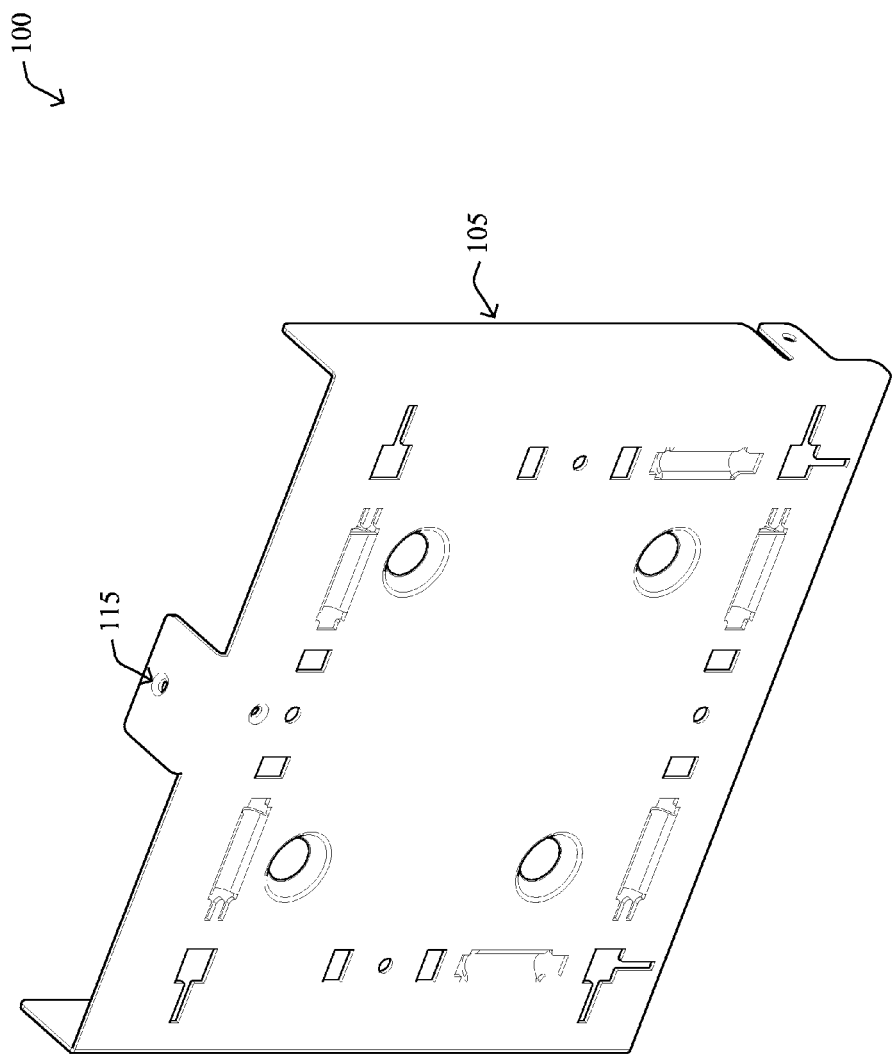
FIG. 1 illustrates an example frame configured to hold an electronic device.

Illustratively, as shown in FIG. 1, the frame 100 configured to hold an electronic device may be a plate like structure having a plurality of bent edges 105 to support the device via screw mounts. In addition, the frame 100 may have a plurality of mounting apertures 115 that are configured to receive the electronic device based on a plurality of mounting configurations. In particular, the frame may have various DIN mounting features on three or four sides. For example, as later described in FIG. 3, a screw 310 may be used to mount the electronic device to the frame. However, this is merely an example and the disclosure is not limited to this type of mounting feature. Therefore, the DIN mounting features such as springs, molded locks, extruded lips, screws, and the like may be moved to any of the four sides of the frame (e.g., bracket) to allow an electronic device (or a similar product) to be installed within a DIN cabinet in various orientations (e.g., three or four orientations). In other words, the same frame structure may be configured to hold various electronic device configurations having different mounting orientations without requiring any changes to the structure of the frame itself.

Figure 2:
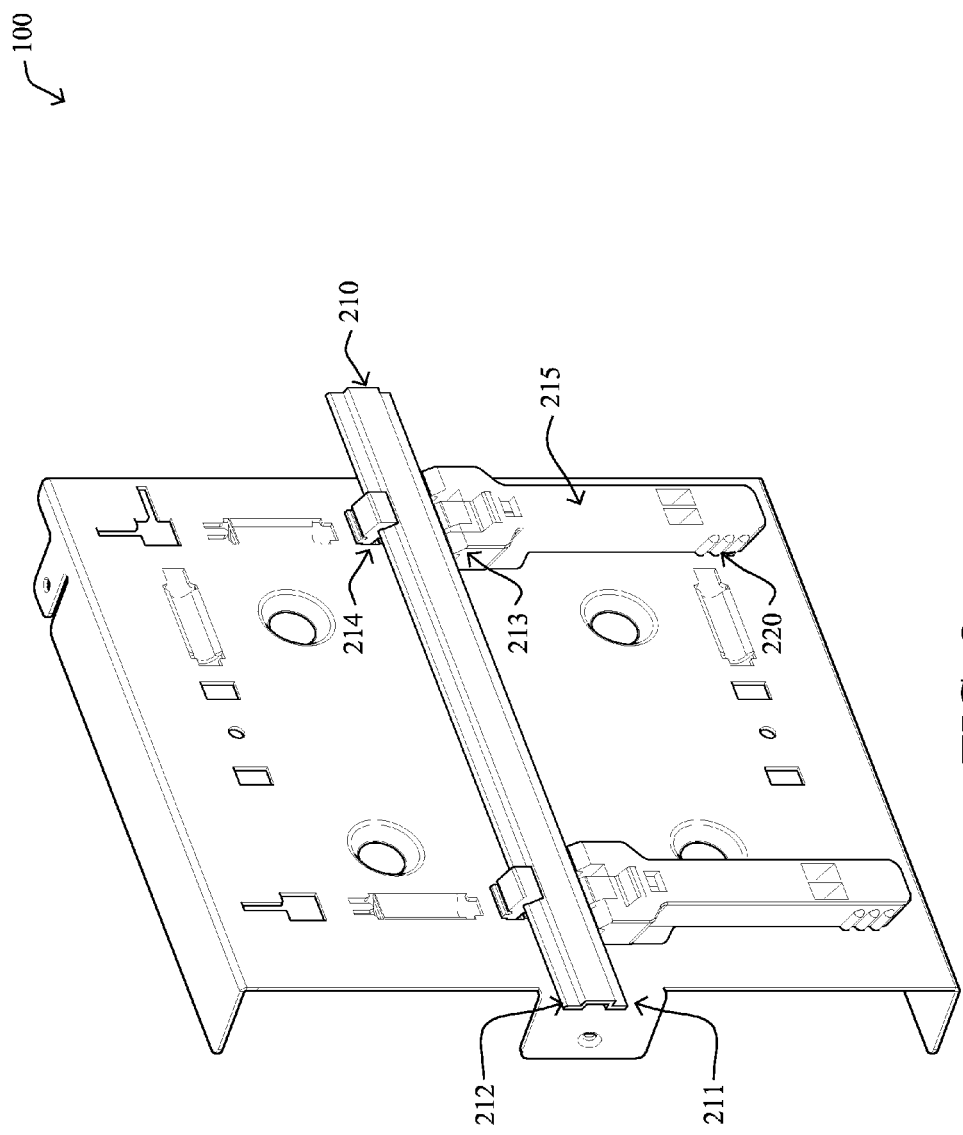
FIG. 2 illustrates an example frame having clamps and retractable levers mounted to a mounting rail.

To attach the frame 100 onto the mounting rail 210 (e.g., the DIN rail) to hold an electronic device by the frame, a plurality of clips 205 may be attached to a back side of the plate 100, as shown in FIG. 2. A second portion 214 (e.g., a top portion) of each clip 205 may be formed generally as a C-shape to be hooked onto a second lip 212 (e.g., a top lip) of the rail 210. Once the second portion 214 of each clip 205 is attached to the second lip 212 of the rail 210, the plate 100 may be snapped into a first portion 213 (e.g., a bottom portion) of each clip 205 (e.g., by depressing spring-activated retractable levers 215), providing a substantially flush mounting configuration. In particular, to prevent the plate 100 from moving along the mounting rail 210 due to, for example, generated mechanical vibrations, one or more retractable levers (e.g., plungers) 215 may be attached at a first portion 213 (e.g., a bottom portion) of each clip 205. Specifically, each of the levers 215 may include a compression spring that pushes the first portion 213 of each clip 205 up toward the rail 210. In other words, the spring generates a force onto the first portion 213 of each clip 205 to press against the first lip 211 (e.g., a bottom lip) of the rail 210. The force generated by each lever 215 prevents a y-axis direction vibration from dislodging the plate 100 from the rail 210. The stabilization of the plate 100 onto the rail 210 also prevents the electronic device attached to the plate from engaging other electronic device units due to movement along the rail 210, thus preventing disruption in the thermal spacing, vibration spacing, or cable routing channels.

Furthermore, the retractable levers 215 provide a simplified method of dismounting or detaching the plate 100 from the rail 210. As seen in FIG. 2, the retractable levers 215 may each include a gripping portion 220 on a distal end thereof. The gripping portion 220 of each lever 215 may be pulled downward (e.g., in a negative y-axis direction or away from the mounting rail) to release each lever 215 from the first lip of the rail 210. However, the gripping portion 220 of each lever 215 may be pulled away from the mounting rail to release each lever 215 from a first lip 211 (e.g., a bottom lip) or a second lip 212 (e.g., a top lip) opposing the first lip 211. Once the levers 215 have been pulled downward (e.g., away from the mounting rail), the mounting unit (e.g., the frame and the electronic device mounted to the frame) may be rotated upward and out from the rail 210. The gripping portion 220 may extend either beyond the length of the frame 100 or may extend about to the length of the frame 100 when in a retracted position (e.g., when the lever is not pulled away from the mounting rail). Therefore, the gripping portion 220 may be easily accessed from a bottom (e.g., or another edge) of the frame 100 for simplified removal of the frame 100 from the rail 210 by a user. The access to the gripping portions 220 of the levers 215 also allows the mounting system (e.g., the frame holding the electronic device) to be substantially flush against the mounting rail 210 since minimal space is required to remove the mounting system from the rail 210.

Figure 3:
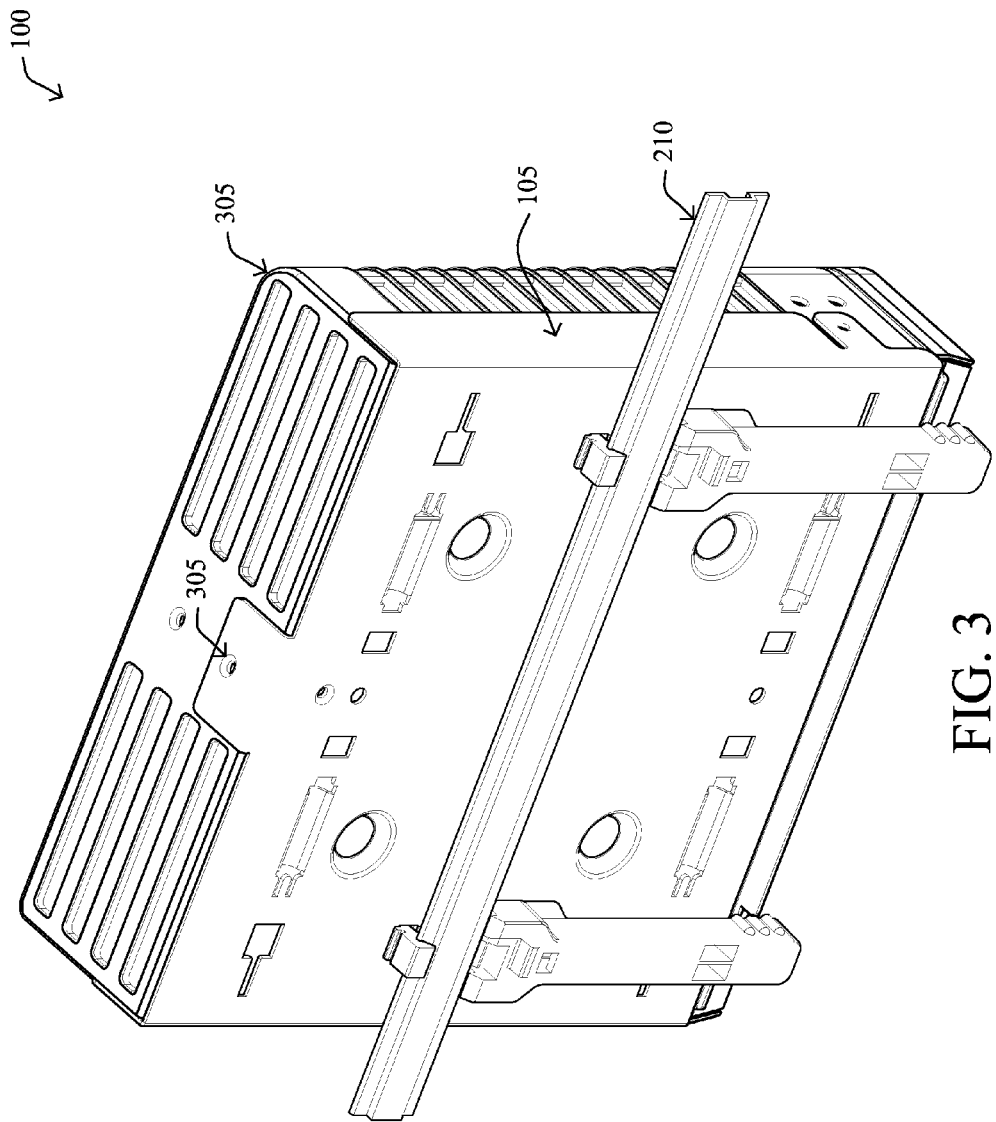
FIG. 3 illustrates an example frame mounted to a mounting rail and holding an electronic device.

FIG. 3 illustrates an example frame mounted to a mounting rail (e.g., a DIN rail) and holding an electronic device. The frame 100 may include a plurality of mounting apertures 310 configured to receive the electronic device 305 based on a plurality of mounting configurations. The mounting apertures 310 of the frame 100 may correspond to a plurality of mounting apertures of the electronic device 305. The bent edges 105 of the frame 100 may be configured to hold the electronic device 305 via a plurality of screws or other fastening mechanisms. The bent edges 105 may include a shorter edge which may be shorter in length than the other edges to accommodate various features of the electronic device, such as electric cables, wireless antennas, displays, local area network (LAN) connections, vents, controls, ports, etc.

FIGS. 4A-6B illustrate the various orientations that the frame may be attached onto the mounting rail. The electronic devices may require different mounting configurations based on which side various electronic device features (e.g., cables, wireless antennas, local area networks (LAN) connections, and the like) extend from the device. In other words, the frame may be mounted onto the rail in a particular orientation based on the mounting configuration of a particular electronic device. The capability of mounting electronic devices having different mounting configurations onto a single mounting frame prevents the requirement of multiple mounting assemblies. Additionally, installers are provided with multiple options of installing electronic devices in a minimal space.

Figure 4A:
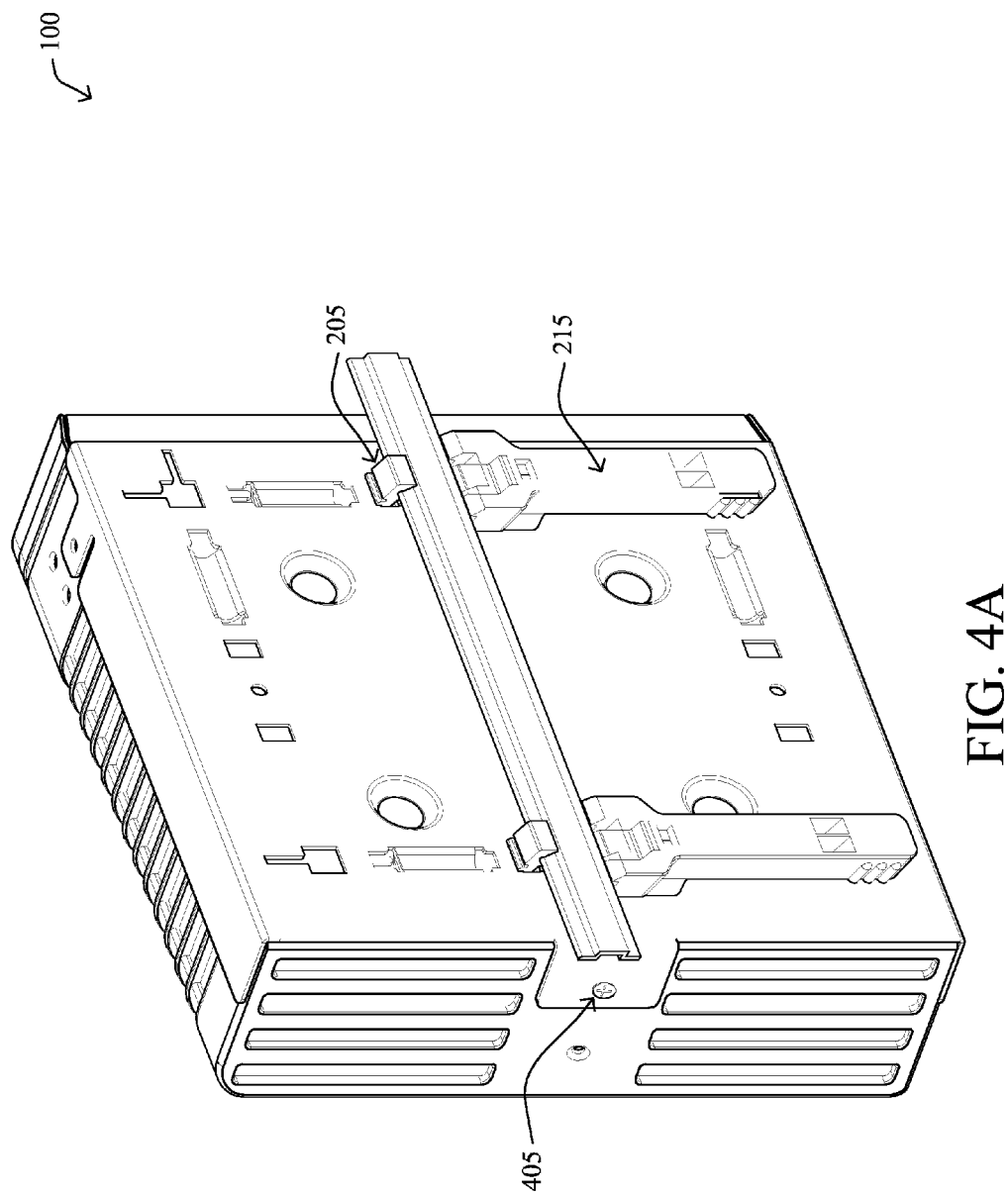
FIGS. 4A-4B illustrate examples of a frame holding an electronic device with a left cable exit.
Figure 4B:
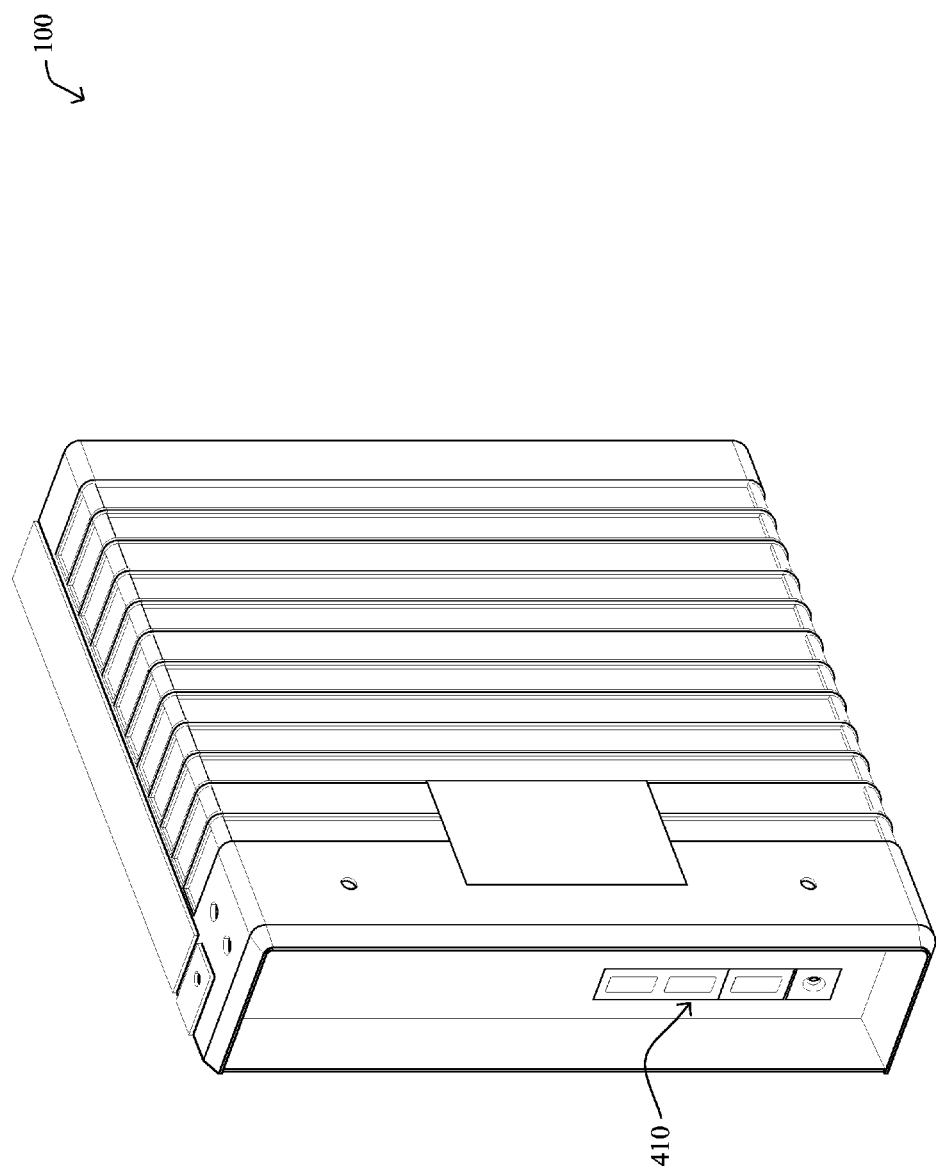

In particular, FIGS. 4A and 4B illustrate an example mounting configuration of an electronic device having cables (or other electronic device features) extending from a left side. FIG. 4A shows the frame 100 having a plurality of clips 205 and a plurality of retractable levers (e.g., plungers) 215 that are configured to push up against a first portion of each clip 205. A plurality of screws 405 are configured to hold the electronic device to the frame 100. FIG. 4B illustrates another view of the mounting configuration showing the cables extending from the electronic device. As shown in FIG. 4B, the side of the electronic device from which cables 410 extend, does not have a bent edge, thus allowing the cables to freely extend from the device.

Figure 5A:
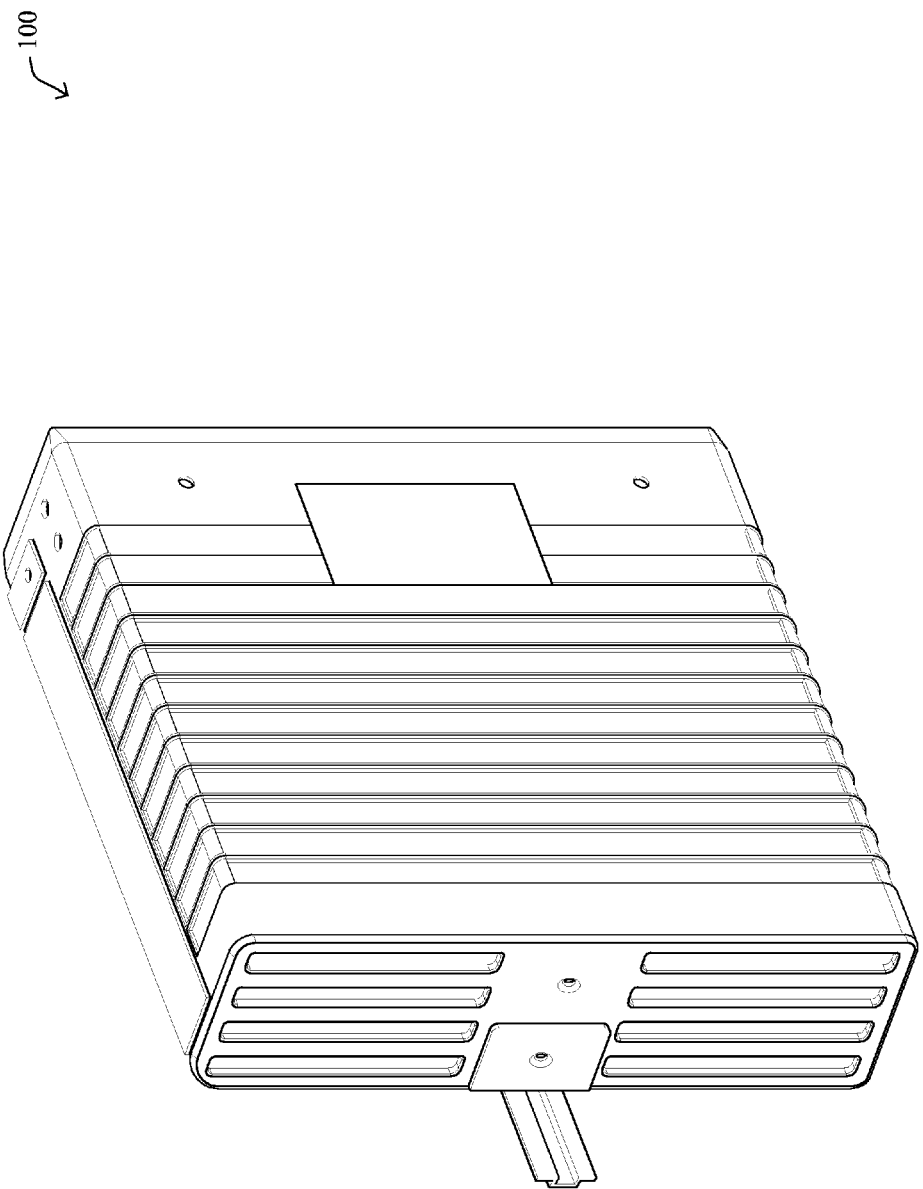
FIGS. 5A-5B illustrate examples of a frame holding an electronic device with a right cable exit.
Figure 5B:
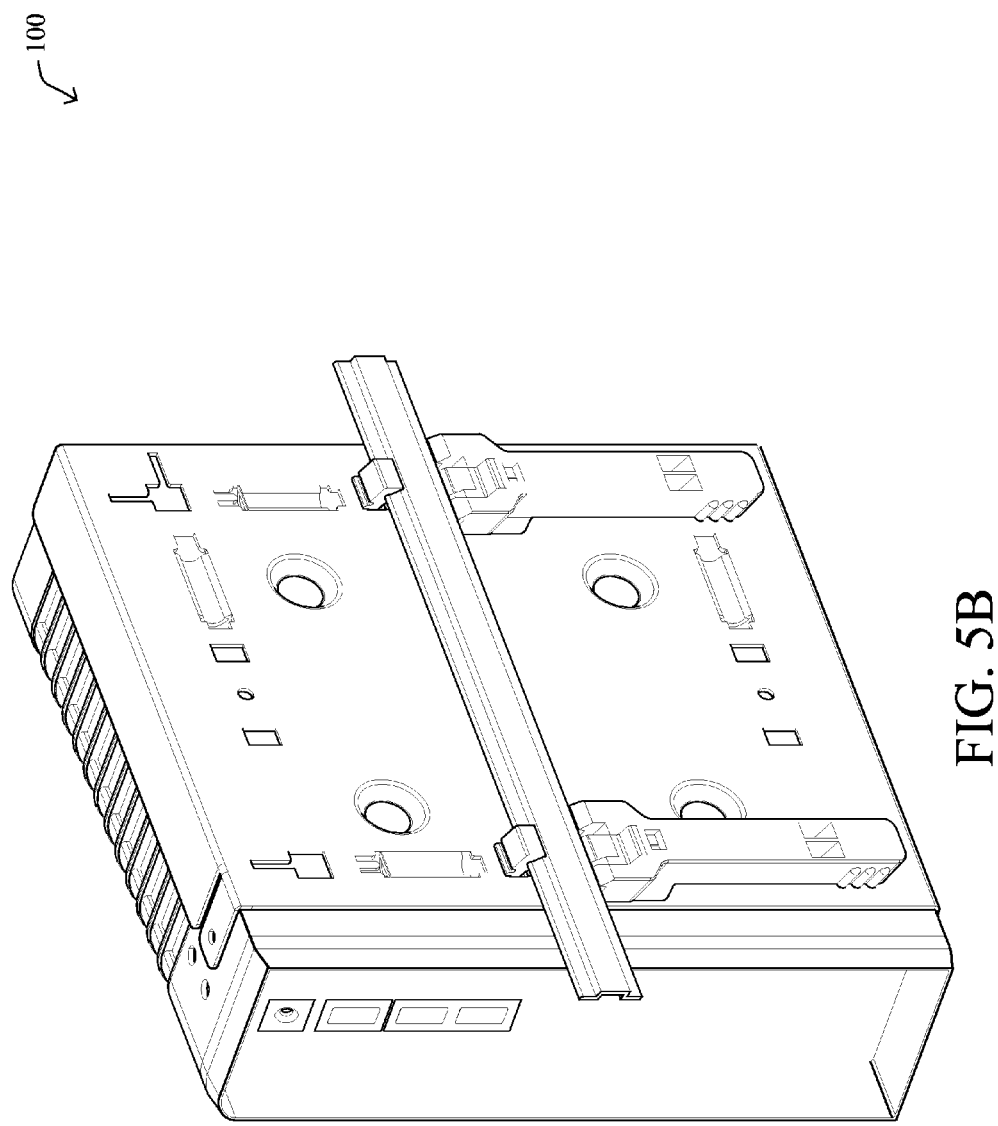
Figure 6A:
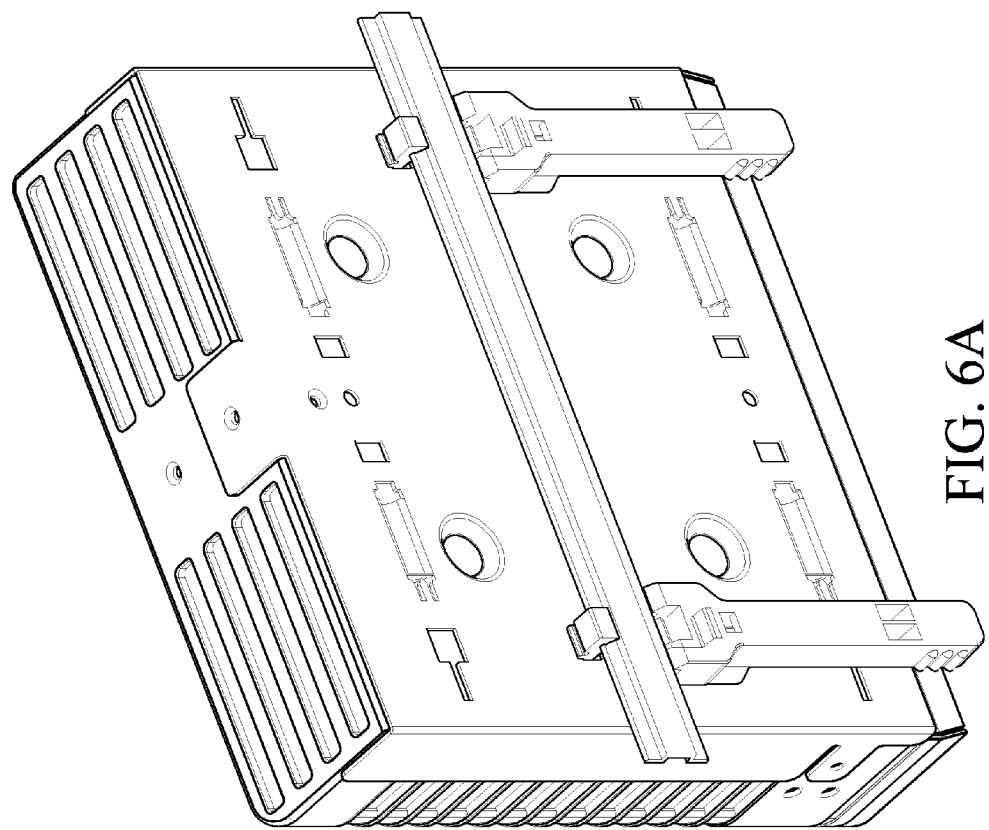
FIGS. 6A-6B illustrate examples of a frame holding an electronic device with a bottom cable exit.
Figure 6B:
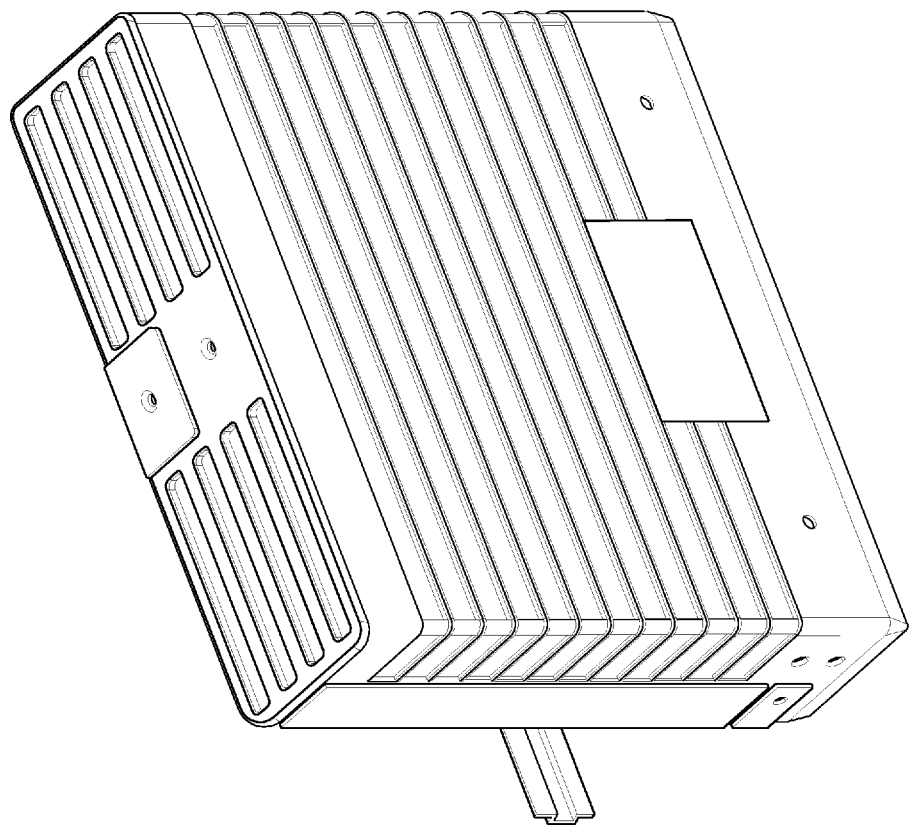

FIGS. 5A and 5B illustrate an example mounting configuration of an electronic device having cables (or other electronic device features) extending from a right side. Similarly, FIGS. 6A and 6B illustrate an example mounting configuration of an electronic device having cables (or other electronic device features) extending from a bottom side. The mounting configurations of FIGS. 5A-6B are similar to the configurations of FIGS. 4A and 4B and thus a detailed description thereof will be omitted. FIGS. 4A-6B illustrate that the same mounting plate may be used for various mounting configurations based on the mounting configuration of a particular electronic device. Therefore, a center cable routing configuration or an outside cable routing installation may be used with the same mounting system (e.g., plate like structure). In addition, when an electronic device includes cables extending from a front side, the mounting system may be configured to allow a portion of the cables to extend from the system to the left and another portion extend from the system to the right.

The techniques described herein, therefore, provide for a configurable mounting bracket for mounting rail installations that is capable of being removed from the rail using a plurality of retractable levers, providing a substantially narrower mounting configuration. The narrower mounting configuration may allow a DIN cabinet to be reduced in thickness, for example, the mounting configuration may be placed in a cabinet that is about 170 mm deep. The retractable levers may be accessed from the bottom of the frame (or another edge of the frame), allowing from simplified installation of the mounting system. In addition, the retractable levers may include a compression spring providing a force up against a first lip of the rail, thus preventing the mounting system from moving along the rail when, for example, mechanical vibrations are generated. The configurable mounting bracket may provide mounting of electronic device in a DIN cabinet in at least four different orientations, providing mounting flexibility.

The foregoing description has been directed to specific embodiments. It will be apparent; however, that other variations and modifications may be made to the described embodiments, with the attainment of some or all of their advantages. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. An apparatus, comprising:
a frame configured to hold an electronic device;
a plurality of clips attached to a back side of the frame and configured to receive a mounting rail; and
one or more retractable levers attached at a first portion of each clip to prevent movement of the frame along the mounting rail,
wherein the frame has a plurality of mounting apertures configured to receive the electronic device based on a plurality of mounting configurations, and
wherein the frame is configured to attach onto the mounting rail via the clips in various orientations selected from the plurality of mounting configurations.

2. The apparatus of claim 1, wherein the frame is a plate like structure.

3. The apparatus of claim 1, wherein the frame has a plurality of bent edges to hold the electronic device via a plurality of fastening mechanisms.

4. The apparatus of claim 3, wherein a length of the bent edges is configured to provide access to one or more electronic device features along edges of the electronic device.

5. The apparatus of claim 1, wherein each retractable lever includes a compression spring to generate a force onto a first portion of the clip to press against a first lip of the mounting rail.

6. The apparatus of claim 1, wherein each lever is pulled away from the mounting rail to release the apparatus from the mounting rail.

7. The apparatus of claim 1, wherein the plurality of mounting configurations are based on a side of the electronic device from which one or more electronic device features extend.

8. The apparatus of claim 7, wherein the one or more electronic device features is selected from a group consisting of: electric cables, wireless antennas, controls, displays, vents, ports, and local area network (LAN) connections.

9. The apparatus of claim 1, wherein the frame is configured to mount substantially flush against the mounting rail.

10. The apparatus of claim 1, wherein each of the plurality of mounting apertures corresponds to a mounting aperture of the electronic device.

11. The apparatus of claim 10, wherein the electronic device is attached to the frame by a plurality of fastening mechanisms via the mounting apertures.

12. The apparatus of claim 1, wherein each of the retractable levers includes a distal end having a gripping portion that is pulled away from the mounting rail to release each retractable lever from a first lip of the mounting rail.

13. The apparatus of claim 1, wherein a second portion of each clip is configured to hold a second lip of the rail and the first portion of the clip is snapped onto a first lip of the mounting rail and is held in place by each retractable lever.

14. The apparatus of claim 1, wherein the plurality of clips are configured to receive the mounting rail in a y-axis direction.

15. The apparatus of claim 1, wherein the mounting rail is a Deutsches Institut für Normung (DIN) mounting rail.

16. The apparatus of claim 1, wherein each retractable lever extends beyond the length of the frame in a retracted position.

17. The apparatus of claim 1, wherein each retractable lever extends about to the length of the frame in a retracted position.

18. A method, comprising:
receiving, by a plurality of clips attached to a back side of a frame, a mounting rail;
preventing movement of the frame along the mounting frame by a retractable lever attached at a first portion of each clip;
attaching the frame onto the mounting rail via the plurality of clips in an orientation based on a selected mounting configuration from a plurality of mounting configurations of an electronic device; and
holding the electronic device by the frame.

19. The method of claim 18, further comprising:
generating a force onto the first portion of each clip by a compression spring of each retractable lever to press against a first lip of the mounting rail.

20. The method of claim 18, further comprising:
pulling the retractable lever away from the mounting rail to release the frame from the mounting rail.

* * * * *